United States Patent [19]

Gronau

[11] Patent Number: 4,731,653
[45] Date of Patent: Mar. 15, 1988

[54] MULTI-CHANNEL, CONTROLLED AMPLIFICATION FACTOR ELECTRONIC AMPLIFIER CONSTRUCTION, PARTICULARLY FOR COLOR TV CONTRAST ADJUSTMENT

[75] Inventor: Gerald Gronau, Hildesheim, Fed. Rep. of Germany

[73] Assignee: Blaupunkt-Werke GmbH, Hildesheim, Fed. Rep. of Germany

[21] Appl. No.: 924,608

[22] Filed: Oct. 29, 1986

[30] Foreign Application Priority Data

Nov. 16, 1985 [DE] Fed. Rep. of Germany ....... 3540752

[51] Int. Cl.[4] .............................................. H04N 5/57
[52] U.S. Cl. .................................... 358/169; 330/252; 358/37
[58] Field of Search ................... 358/37, 40, 169, 168, 358/184; 330/252

[56] References Cited

U.S. PATENT DOCUMENTS

| | | | |
|---|---|---|---|
| 3,619,797 | 11/1971 | Merrick | 330/252 X |
| 3,638,131 | 1/1972 | Sarkissian | 330/252 |
| 3,846,710 | 11/1974 | Chapman | 330/252 X |
| 4,035,840 | 7/1977 | Teuling | 358/184 |
| 4,072,907 | 2/1978 | Sekiya et al. | 330/252 X |
| 4,101,927 | 7/1978 | Isono et al. | 358/169 X |
| 4,143,398 | 3/1979 | Harwood et al. | 358/168 X |
| 4,266,204 | 5/1981 | Jacoby | 330/252 X |
| 4,350,995 | 9/1982 | Harlan | 358/37 |
| 4,422,095 | 12/1983 | Hosoya | 358/169 X |
| 4,495,469 | 1/1985 | Numata | 330/252 X |
| 4,504,853 | 3/1985 | Faroudja | 358/40 X |
| 4,523,232 | 6/1985 | Kameda et al. | 358/169 X |
| 4,555,671 | 11/1985 | Numata | 330/252 |
| 4,559,566 | 12/1985 | Suenaga | 358/37 X |

Primary Examiner—James J. Groody
Assistant Examiner—E. Anne Faris
Attorney, Agent, or Firm—Frishauf, Holtz, Goodman & Woodward

[57] ABSTRACT

The multi-channel amplifier is placed on a common substrate to form a hybrid circuit network, for example a common silicon chip. A source of control voltage is provided connected in common to the base terminals of a pair of transistors, which have their emitters coupled together. The output is taken from the collector of one of the transistors via an emitter-follower transistor. The commonly connected emitters of the pair of transistors are connected through a current supply source forming a third transistor to a source of operating voltage.

19 Claims, 2 Drawing Figures

MULTI-CHANNEL, CONTROLLED AMPLIFICATION FACTOR ELECTRONIC AMPLIFIER CONSTRUCTION, PARTICULARLY FOR COLOR TV CONTRAST ADJUSTMENT

The present invention relates to a controlled amplification factor amplifier for multi-channel use, and more particularly for such an amplifier suitable for controlling the contrast setting in a color TV monitor or receiver.

BACKGROUND

Contrast adjustment in color TV receivers, particularly those which have inputs for chroma signals red, green and blue (RGB), require amplifiers in which the amplification of respective channels for the respective colors are the same over the entire adjustment range. The frequency band width of wide-band RGB monitors requires circuits which uniformly amplify the wide frequency signals, independently of the respectively set adjustment of the contrast amplification.

Contrast amplifiers of the type to which the present invention relates have, for each channel, a pair of emitter coupled transistors, formed of first and second transistors, and a third transistor, the collector of the third transistor being coupled to the emitter of the first and second transmission of the pair. The emitter of the third transistor is coupled through an emitter-resistor to one terminal of a source of operating voltage.

THE INVENTION

It is an object to provide a circuit in which, over the entire adjustment range, the amplification factors of the amplifiers formed by the transistors remain uniform over the entire adjustment range, while being capable of handling wide-band signals, that is, signals extending over a substantial frequency range, the amplification factor being independent of the particular frequency involved.

Briefly, in accordance with the invention, the amplifier comprises a construction in the form of a hybrid circuit, in which some elements are located on common substrates, the substrates all being taken from the same wafer or chip. The amplifier has emitter coupled transistor pairs as well as a third transistor, the emitter coupled transistor pairs and the third transistor for each channel being located on a common substrate to thereby provide, for three channels, three substrates which are all taken from the same wafer. The three substrates are connected into a hybrid circuit network, which may include other elements such as resistors and the like, also taken from the same wafer. Preferably, a source of control voltage is provided, coupled to the base terminals of one of the transistors of the pair of each channel so that the control voltage will be connected, in common, to all the channels. The arrangement insures homogeneous temperature response of the elements of the amplifier, with temperature drift between channel amplifiers being effectively eliminated. The amplifier stages are connected in parallel. Aging of the amplifier stages also will be uniform.

The circuit has the advantage that the amplification factors of the amplifiers for the respective channels, typically the three channels for red, green and blue (RGB) operate in unison. Control of the amplification factor is by a d-c voltage, which is a substantial advantage since it eliminates conducting video signals over connections or conducting lines to an operating adjustment knob, console or the like, which may be remote from the display unit of a monitor. The adjustment can readily be controlled by a computer via a digital/analog converter. Additionally, a control signal can be derived from the monitor in order to limit the average beam current, and this control signal can readily be coupled to the circuit.

The circuit network has the additional advantage that it can be used universally, has low power dissipation and can be constructed in a very small space. Frequencies of over 100 MHz can be handled thereby.

DRAWINGS

FIG. 1 is a schematic circuit diagram of the circuit which is preferably placed on a single silicon chip; and FIG. 2 is a circuit diagram of the circuit in a network for providing additional control signals and deriving output signals, and in which the circuit of FIG. 1 is shown in block form.

Detailed Description

Figure 1:
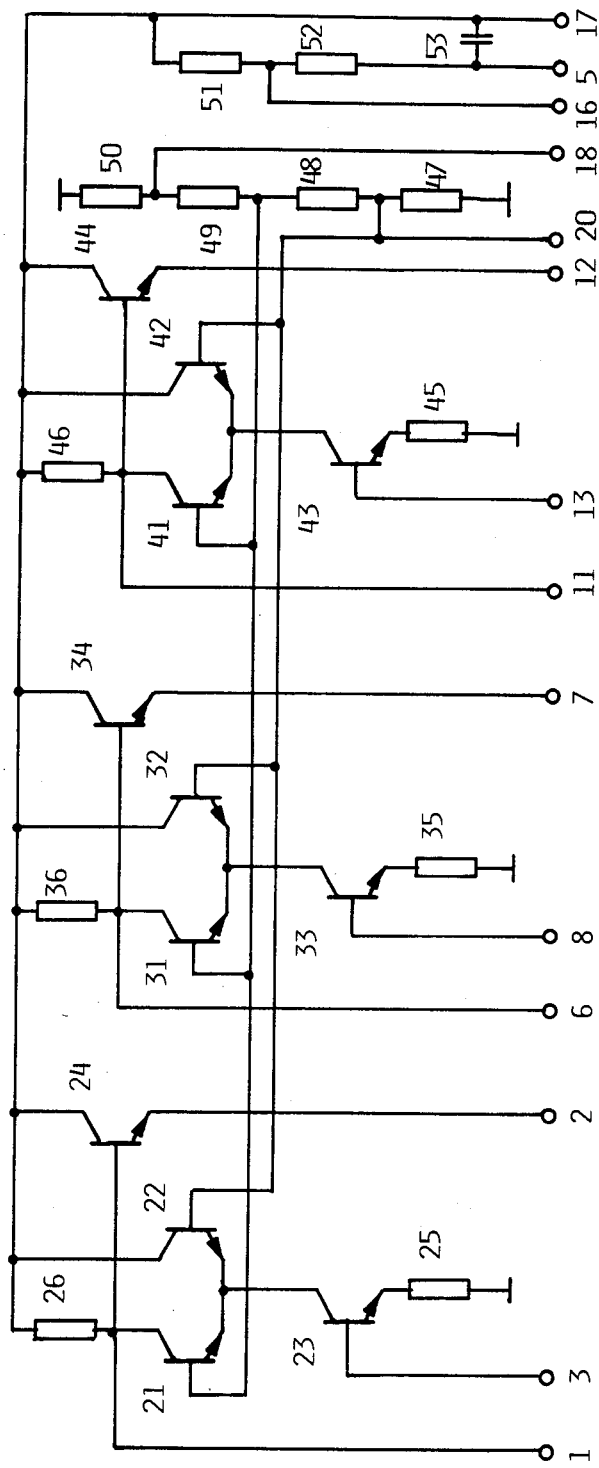

Referring first to FIG. 1: Three amplifiers, one each for a channel R, G and B, are provided, the amplification factor of which can be controlled. The circuits of the three channels R, G, B are identical, and the details of the circuit will be described in connection with the red or R channel.

The amplification factor is controlled by a pair of transistors 21, 22, which have their emitters coupled together to a common junction. The two transistors 21, 22, forming a first and second transistor of the pair, have their emitters connected, via the common junction to the collector of a third transistor 23. The third transistor has its emitter connected through an emitter resistor 25 to one terminal, for example reference, ground or chassis, of a current supply source. The first transistor 21 of the pair has its collector connected to a collector-resistor 26, the second terminal of which is connected to the positive supply terminal 17 of the operating source, the negative terminal of which is connected to ground, chassis or reference. The collector of the second transistor 22 is coupled directly to the positive terminal 17 of the operating source. The base of the second transistor 22 is coupled in common to the bases of transistors 32, 42, that is, the second transistors of the respective channels G, B, and then to a terminal 20. Terminal 20 is coupled to a voltage source, not shown in FIG. 1, which provides a fixed, constant bias voltage. The collector of the first transistor 21 of the pair is connected to the base of a fourth transistor 24, connected as an emitter-follower, the output of which is connected to the output terminal 2 of the channel R. The base of the fourth transistor 24 is, also, connected to a further input 1 of the R channel.

The circuits for the channels G and B are identical, and include the transistors 31, 32, 33 and 34, and resistors 35, 36 for the G channel; and transistors 41, 42, 43 and 44, and resistors 45, 46 for the channel B.

The base connections of the second transistors 22, 32, 42 are not only connected to the bias supply source 20 but also over resistor 47 to ground or chassis. The base terminals of the transistors 21, 31, 41 are connected to a common supply line which is connected through a resistor 49 to a terminal 18 which provides a d-c supply voltage to control the amplification, and, in a color monitor, the contrast. A further resistor 50 is connected between the junction of terminal 18 and resistor 49 to ground or chassis.

A capacitor 53 is provided, blocking the operating voltage with respect to ground or chassis. Ground or chassis is connected to terminal 5. A voltage divider 51, 52 provides a bias voltage, available at terminal 16, for a clamping circuit, to be described in connection with FIG. 2.

OPERATION

Current through the third transistor 23 (33, 43 for the other two channels) is controlled in accordance with the voltage connected to terminals 3, 8, 13, respectively. The negative feedback resistor 25 (35, 45, respectively) provides for necessary linearity. The current, corresponding to the chroma value signal, is split between the emitter-collector main current paths of the transistors 21, 22 of the pair. The portion flowing through the first transistor 21 causes a voltage drop across the collector-resistor 26 which multiplies the chroma signal with the portion of the current corresponding to the transistor 21. This portion can be controlled by controlling the base of transistor 22, as well as the base terminals of transistors 32, 42, by a constant voltage connected to terminal 20. The base of the transistor 21, together with the base terminals of transistors 31, 41, receives a control voltage applied by terminal 18 and, reduced, by the voltage divider 48, 49. To control the transistors 21, 22 from one end condition of the adjustment range to the other requires only a minute voltage difference. For constructional reasons within monitors, it is desirable to provide a higher voltage than necessary to control the circuit in accordance with the present invention and, therefore, the voltage divider 48, 49 is used.

Terminal 20 receives a constant voltage, thus applying a control voltage at 18 and through the voltage divider network 47, 48, 49, 50, as shown, will affect the voltage applied to the bases of the transistors 21, 31, 41 only to a minor extent, to insure linearity, without, however, essentially affecting the operation of the circuit as described.

The output signals are derived at the terminals 2, 7, 12, respectively, from the emitters of the fourth transistors 24, 34, 44, connected as emitter-followers.

It is frequently necessary to introduce signals already available in a circuit, for example a reference level signal derived from a cut-off automatic circuit. The circuit as described can readily accept additional modulating or modifying signals by simply applying such modulating or modifying signals to the terminals 1, 6, 11. If, for example, the control voltage at terminal 18 is placed on ground potential, only the additional signals applied to terminals 1, 6, 11 will reach the output terminals 2, 7, 12. If, however, the input terminal 18 is placed at a voltage other than ground, chassis or reference, the signals applied to terminals 1, 6, 11 are mixed with the signal applied to terminal 18. For example, to introduce a reference level, terminals 1, 6 and 11 can be connected to ground potential; the output terminals 2, 7, 12 then will have the reference level thereon, entirely independently of the adjustment of the value of the control voltages applied to the bases of the transistors 23, 33, 43 over the terminals 3, 8, 13.

In accordance with a modification of the present invention, the base of the transistor 21 may be supplied with a fixed bias voltage and the base of the transistor 22 may have a control voltage applied thereto. It is also possible to provide control voltages to the two transistors of the pair, in opposite direction.

Figure 2:
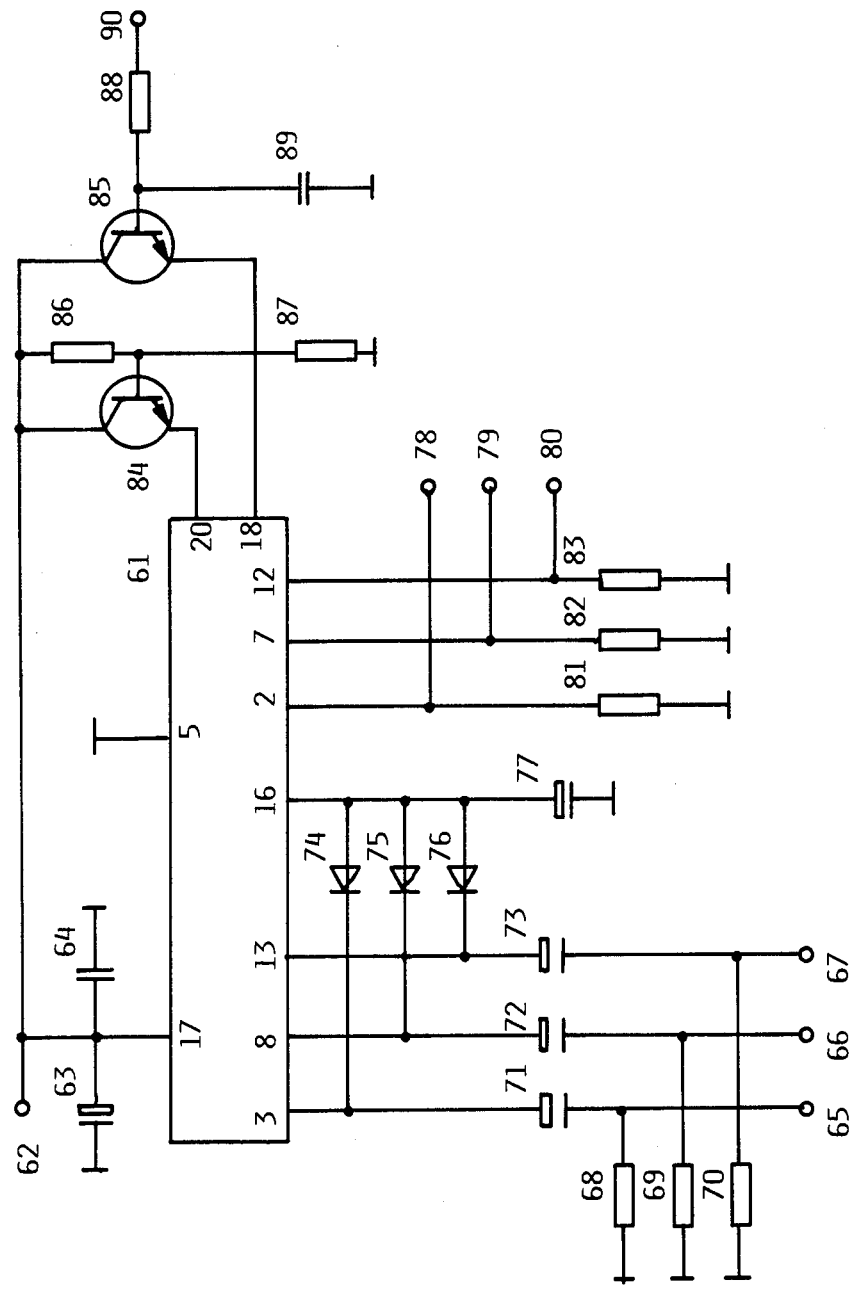

FIG. 2 shows a network in which the circuit of FIG. 1 is shown schematically as a hybid 61. The terminals of the hybrid 61 are the same terminals having the reference numerals shown in FIG. 1.

Operating voltage is connected to terminal 17 of the hybrid 16 from a terminal 62 of an external voltage supply. Two capacitors 63, 64 provide filtering against ground or chassis. The chroma signals R, G, B are connected to inputs 65, 66, 67, which are connected to ground or chassis via respective resistors 68, 69, 70 to form dropping resistors, and are additionally connected to a clamping circuit formed, in well known construction, of a respective capacitor 71, 72, 73 and a clamping diode 74, 75, 76. Clamping voltage is derived from the hybrid circuit 61, terminal 16 - see also FIG. 1, which shows the terminal 16 connected to the voltage divider of the main supply circuit. A capacitor 77 provides filtering to ground or chassis. Terminals 2, 7, 12 of the hybrid circuit 61 are connected to the final output terminals 78, 79, 80 to provide amplitude controlled chroma signals R, G, B. Dropping resistors 81, 82, 83 are connected between the respective output terminals and ground or chassis.

Two further transistors 84, 85, each having the collector connected to the positive terminal of the operating source and the emitter to the respective terminal of the hybrid circuit 61, are provided in order to supply the control circuits for biassing. The base of transistor 84 is supplied with a constant voltage by the voltage divider 86, 87. The base of the transistor 85 is connected to a control voltage derived at terminal 90 via a low-pass filter formed by resistor 88 and capacitor 89, in standard low-pass filter connection.

Various other changes and modifications may be made within the scope of the inventive concept.

What is claimed is:

1. A multi-channel, controlled-amplification-factor electronic amplifier construction, for adjusting contrast in a color television monitor having contrast setting means, wherein each channel comprises first and second transistors (21, 22; 31, 32; 41, 42) forming, together, a pair, said first and second transistors being emitter-coupled, and a third transistor (22, 33, 43), the collector of the respective third transistor being coupled to the emitters of the first and second transistors forming the pair, the emitter of the third transistor being coupled, through an emitter-resistor (25, 35, 45), to a reference terminal (5) of a current supply source;

and wherein, in accordance with the invention, channel input terminals (3, 8, 13) are provided, each connected to a respective base terminal of a respective one of said third transistors (22, 33, 43);

said first one (21, 31, 41) of the transistors of each pair (21, 22; 31, 32; 41, 42) is coupled through a collector-resistor (26, 36, 46) to a second terminal (17) of said current supply source; and a respective emitter-follower transistor (24, 34, 44) is connected to the collector of said first transistor (21, 31, 41) and to a respective output terminal (2, 7, 12) of a respective channel;

the transistors forming the pair of transistors and the third transistor (22, 33, 43) for each channel are formed on respective common substrates to provide a plurality of common substrates for each channel;

said common substrates are all derived from the same wafer or chip; and wherein said amplifier comprises a hybrid circuit network including said common substrates for the respective channels and at least said emitter-resistors (25, 35, 45).

2. The amplifier construction of claim 1, wherein said common substrate comprises a common silicon chip.

3. The amplifier construction of claim 1, wherein auxiliary input terminals (1, 6, 11) are provided, coupled to respective collectors of said first transistor.

4. The amplifier construction of claim 1, wherein one of the transistors (21, 31, 41) of the pair is connected to a second terminal (17) of the current supply source through a respective collector-resistor (26, 36, 46);

and a common control voltage (20) is provided connected, in common, to the base of one of said transistors of the pair.

5. The amplifier construction of claim 4, further including an output coupling circuit comprising an emitter-follower transistor (24, 34, 44) for each channel, the base of the respective emitter-follower transistor being connected to the collector of one of the transistors of the pair of the respective channels.

6. The amplifier construction of claim 1, wherein each channel comprises a chroma channel.

7. The amplifier construction of claim 1, wherein one channel, each, is provided for the red, green and blue chroma signal.

8. The amplifier construction of claim 1, for three channels, comprising three substrates, each including the first and second transistors of the pair and a third transistor.

9. The amplififer construction of claim 1, further including a source (20) of control voltage, the base terminal of one (21, 31, 41) of the transistors of the pair (21, 22; 31, 32; 41, 42) having said control voltage connected thereto in common.

10. The amplifier construction of claim 9, wherein said common substrates comprise a common silicon chip.

11. The amplifier construction of claim 9, wherein input terminals (3, 8, 13) are provided, connected to the base terminals of the respective third transistor (23, 33, 43);

wherein said one (21, 31, 41) of the transistors of the pair (21, 22; 31, 32; 41, 42) is coupled through a collector-resistor (26, 36, 46) to the second terminal (17) of said current supply source;

and a respective emitter-follower transistor (24, 34, 44) being connected to the collector of said one transistor (21, 31, 41) and to the output terminals (2, 7, 12) of the respective channels.

12. The amplifier construction of claim 11, wherein auxiliary input terminals (1, 6, 11) are provided, coupled to the collectors of said one transistor.

13. The amplifier construction of claim 12, further comprising clamping circuits (68–76) connected to said auxiliary inputs.

14. The amplifier construction of claim 9, wherein one of the transistors (21, 31, 41) of the pair is connected to another terminal of the source of operating voltage through a respective collector-resistor (26, 36, 46);

said common control voltage is connected, in common, to the base of one of said transistors of the pair.

15. The amplifier construction of claim 14, further including an output coupling circuit comprising an emitter-follower transistor (24, 34, 44) for each channel, the base of the respective emitter-follower transistor being connected to the collector of one of the transistors of the pair of the respective channels.

16. The amplifier construction of claim 9, wherein each channel comprises a chroma channel.

17. The amplifier construction of claim 9, wherein one channel, each, is provided for the red, green and blue chroma signal.

18. The amplifier construction of claim 9, for three channels, comprising three substrates, each including the first and second transistors of the pair and a third transistor.

19. Multi-channel controlled amplification factor electronic amplifier construction, for adjusting contrast in a color television monitor having contrast setting means, wherein each channel comprises first and second transistors (21, 22; 31, 32; 41, 42) forming, together, a pair, said first and second transistors being emitter-coupled, and a third transistor (22, 33, 43), the collector of the respective third transistor being coupled to the emitters of the first and second transistors forming the pair, the emitter of the third transistor being coupled, through an emitter-resistor (25, 35, 45), to a reference terminal (5) of a current supply source;

and wherein, in accordance with the invention, the transistors forming the pair of transistors and the third transistor (22, 33, 43) for each channel are formed on respective common substrates to provide a plurality of common substrates for each channel;

said common substrates are all derived from the same wafer or chip;

said amplifier comprises a hybrid circuit network including said common substrates for the respective channels and at least said emitter-resistors (25, 35, 45);

auxiliary inputs (1, 6, 11) are provided, each coupled to the collector of a respective one of said first transistor of each pair; and clamping circuits (68–76) are provided, each connected to a respective one of said auxiliary inputs (1, 6, 11).

* * * * *